United States Patent [19]

Sugimoto

[11] Patent Number: 4,987,687
[45] Date of Patent: Jan. 29, 1991

[54] ROTARY WAFER DRIER
[75] Inventor: Kenji Sugimoto, Shiga, Japan
[73] Assignee: Dainippon Screen Mfg. Co., Ltd., Japan
[21] Appl. No.: 413,331
[22] Filed: Sep. 27, 1989
[30] Foreign Application Priority Data
  Sep. 27, 1988 [JP] Japan ............... 63-126606[U]
[51] Int. Cl.⁵ .................................... F26B 17/24
[52] U.S. Cl. .................................. 34/58; 34/184
[58] Field of Search ............. 34/58, 8, 59, 184, 186, 34/187

[56] References Cited
U.S. PATENT DOCUMENTS
4,677,759  7/1987  Inamura .................. 34/58
4,777,732 10/1988  Hirano ................... 34/58
4,848,006  7/1989  Seiichiro ................ 34/58

Primary Examiner—Henry A. Bennet
Assistant Examiner—Denise L. F. Gromada
Attorney, Agent, or Firm—Ostrolenk, Faber, Gerb & Soffen

[57] ABSTRACT

A rotary wafer drying apparatus comprises a rotatable rotor for applying centrifugal force to the wafers, and a motor for rotating the rotor. A pair of cradles, attached to the rotor, receive a plurality of wafers arranged vertically. When the wafers are to be dried, the cradles are rotated by about 90° from the state of reception, with the wafers maintained approximately at the horizontal state. When wafers of different diameters are to be dried and the size of the cradles should be changed correspondingly, not the rotor itself but only the pair of cradles in the rotor are changed.

8 Claims, 7 Drawing Sheets

FIG.6
FIG.7
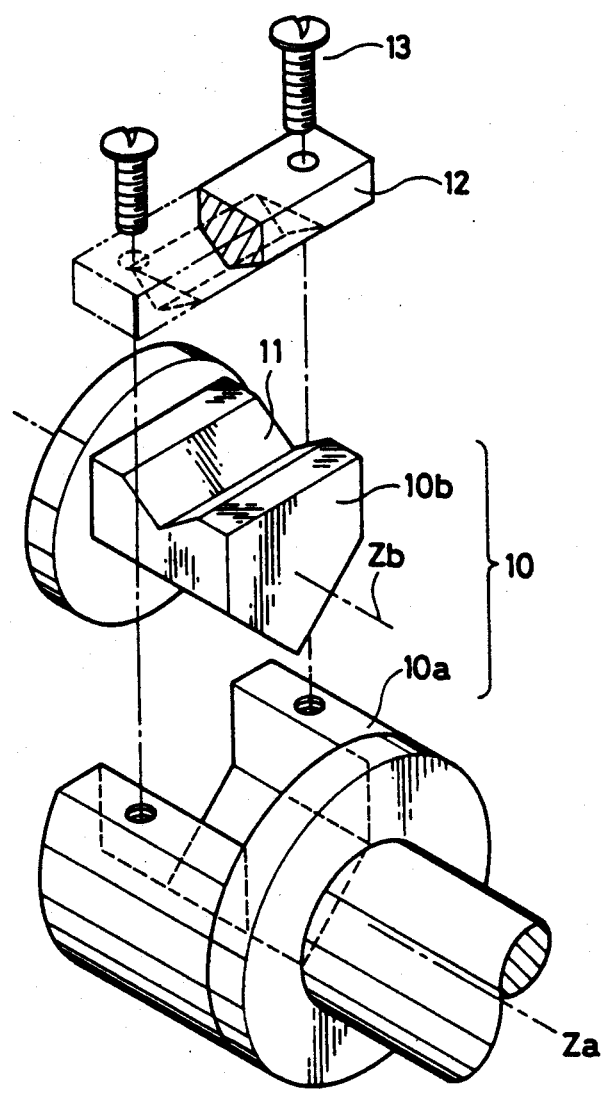
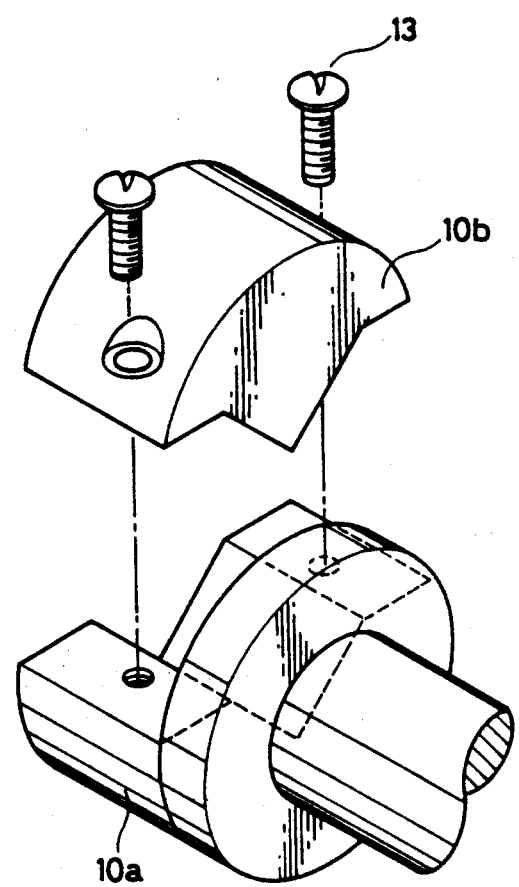

ROTARY WAFER DRIER

BACKGROUND OF THE INVENTION

1. Field of the Invention

The present invention relates to a rotary drier for drying semiconductor substrates or, glass plates for liquid crystal and so on (hereinafter simply referred to as "wafers"), used in the step of drying during manufacturing the wafers. More specifically, the present invention relates to a rotary drier for drying wafers by swishing off liquid drops on the wafers by using centrifugal force.

2. Description of the Related Art

A rotary drier of wafers of interest to the present invention is disclosed in, for example, U.S. Pat. No. 4,677,759. Present FIG. 1 is a perspective view of a rotor which constitutes a main portion of the rotary drier of wafers disclosed in such patent. Referring to present FIG. 1, a conventional rotary drier of wafers comprises a rotor 1 which is rotated in the direction of the arrow in the figure. The rotor 1 comprises a turntable 4 and opposing wall portions 2a and 2b provided on the turntable 4. Pairs of support axes 10a and 10b are provided on opposing positions of the respective wall portions 2a and 2b. The support axes 10a and 10b support a pair of cradles 5a and 5b housing wafers to be dried. When the rotor 1 is in a static state, the pair of cradles 5a and 5b are kept in the state shown at A in the figure. More specifically, the receiving inlet 6 of each of the cradles 5a and 5b is facing upward for receiving wafers to be dried. A plurality of wafers W contained in cassettes 8a and 8b (FIG. 2), which will be described later, are introduced into the cradles 5a and 5b, which wafers were previously subjected to wet surface treatment.

FIG. 2 is a cross-sectional view of a main portion of the rotor shown in FIG. 1 in the rotating state. Referring to FIG. 2, the rotor 1 is rotated as the turntable 4 is rotated by a turntable driving motor 29 provided therebelow. When the rotor 1 is being rotated, the cradles 5a and 5b are kept in the state shown at B in the figure by the centrifugal force. In this state, the plurality of wafers W held in the cassettes 8a and 8b are maintained approximately horizontal and, consequently, the drops on the surfaces of the wafers W are swished off by the centrifugal force.

FIG. 3 is an enlarged view of the portion shown by the numeral III of FIG. 2. Referring to FIG. 3, the turntable 4 of the conventional rotary drier of wafers comprises an upper plate 4a for supporting the wall portions 2a and 2b, a lower plate 4b for transmitting the rotating force of the turntable driving motor 29 to the turntable 4, and a support 4c for connecting the upper and lower plates 4a and 4b. The rotating force of the turntable driving motor 29 is transmitted to the turntable 4 through a rotary driving axis 28. The lower plate 4b of the turntable and the rotary driving axis 28 are connected with each other by means of a plurality of fixing bolts 32. A cap 31 is provided thereon.

The conventional rotary drier of wafers is structured as described above. The outer dimension of the cassettes 8a and 8b is different dependent on the diameter of the wafers W (4 to 8 inch) to be dried. Therefore, when the wafers W having a different diameter are to be subjected to the step of drying, the pair of cradles 5a and 5b housing the cassettes 8a and 8b must be correspondingly changed so that the turntable 4 as a whole is well balanced during rotation.

In the conventional rotary drier of wafers, the wafers W are dried while maintained at a horizontal attitude for swishing off water by the centrifugal force, as shown in FIG. 2. Since a great centrifugal force is applied to the cradle 5, it has been a general understanding that the cradle and the turntable rotatably supporting the same must be an integral durable structure. In addition, since a great centrifugal force is applied to swingable support axes 10a and 10b for integrally supporting the cradles 5 on the wall portions 2a and 2b of the turntable 4, it was thought necessary that the cradles 5a and 5b be integral with the support axes 10a and 10b.

For the above-described reasons, in a conventional rotary drier of wafers, an attaching/detaching mechanism such as a fixing bolt 32 is provided between the turntable 4 and the rotary driving axis 28 for rotating the turntable 4, as shown in FIG. 3. When wafers W having a different diameter are to be dried, not only the cradles 5a and 5b housing the wafers W but the rotor 1 itself is changed to another rotor 1 having a pair of cradles 5a and 5b of different size.

Accordingly, a conventional rotary drier of wafers has the following drawbacks.

(1) A plurality of rotors 1 having cradles 5 of different outer dimensions corresponding to the diameters of differently-sized wafers W must be prepared, which increases the cost of the rotary drier of wafers.

(2) Referring to FIG. 3, the so called "fit" dimension d between a hole provided on the lower plate 4b of the turntable 4 and a concave portion of the rotary driving axis 28 is tight (near tight fit) in order to prevent deviation of the centers of these portions. Therefore, it was very hard to change the rotor 1, which is relatively heavy (e.g. about 20 kg).

SUMMARY OF THE INVENTION

An object of the present invention is to eliminate the above-described problems.

Another object of the invention is to facilitate drying of wafers even when wafers having different diameters are to be dried in a rotary wafer drier.

A further object of the invention is to provide a rotary wafer drier wherein only wafer cradles need be changed and not the rotor itself when the diameter of the wafers is changed in the rotary wafer drier.

A still further object of the invention is to reduce the cost of rotary wafer driers.

Yet another object of the invention is to simplify the structure of a rotary wafer drier.

The above-described objects of the invention can be attained by a rotary wafer drier, comprising a turntable rotating about a prescribed position; a plurality of supporters provided on the turntable; and cradles supported by said supporters for holding a plurality of wafers. The supporters are provided at positions enabling a balanced state of the cradles when the turntable is rotated with the cradles supported by the supporters.

The rotary wafer drier further comprises a swinging apparatus for swingably holding the cradles at a first position and a second position different from the first position; and attaching/detaching apparatus provided on the supporters for attaching and detaching the cradles to and from the supporter.

Since the rotary wafer drier comprises the above described components, cradles are removed from the supporters when they are changed. It is unnecessary to remove the turntable itself. Consequently, only the cradles need be changed when wafers of different sizes are to be dried. Therefore, even when wafers having different diameters are to be dried, the wafers can be readily dried by the rotary wafer drier.

Preferably, the supporter comprises a swinging apparatus. Since the supporter comprises a swinging apparatus in the rotary wafer drier, a rotary wafer drier having a simple structure can be realized.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a perspective view of a rotor portion of a conventional rotary wafer drier;

FIG. 2 shows the state of cradles while the rotor of FIG. 1 is being rotated;

FIG. 3 is an enlarged view of a portion denoted by III in FIG. 2;

FIG. 8 is a perspective view showing a third embodiment of the support axis of the cradle in accordance with the present invention;

DESCRIPTION OF THE PREFERRED EMBODIMENTS

Figure 4:
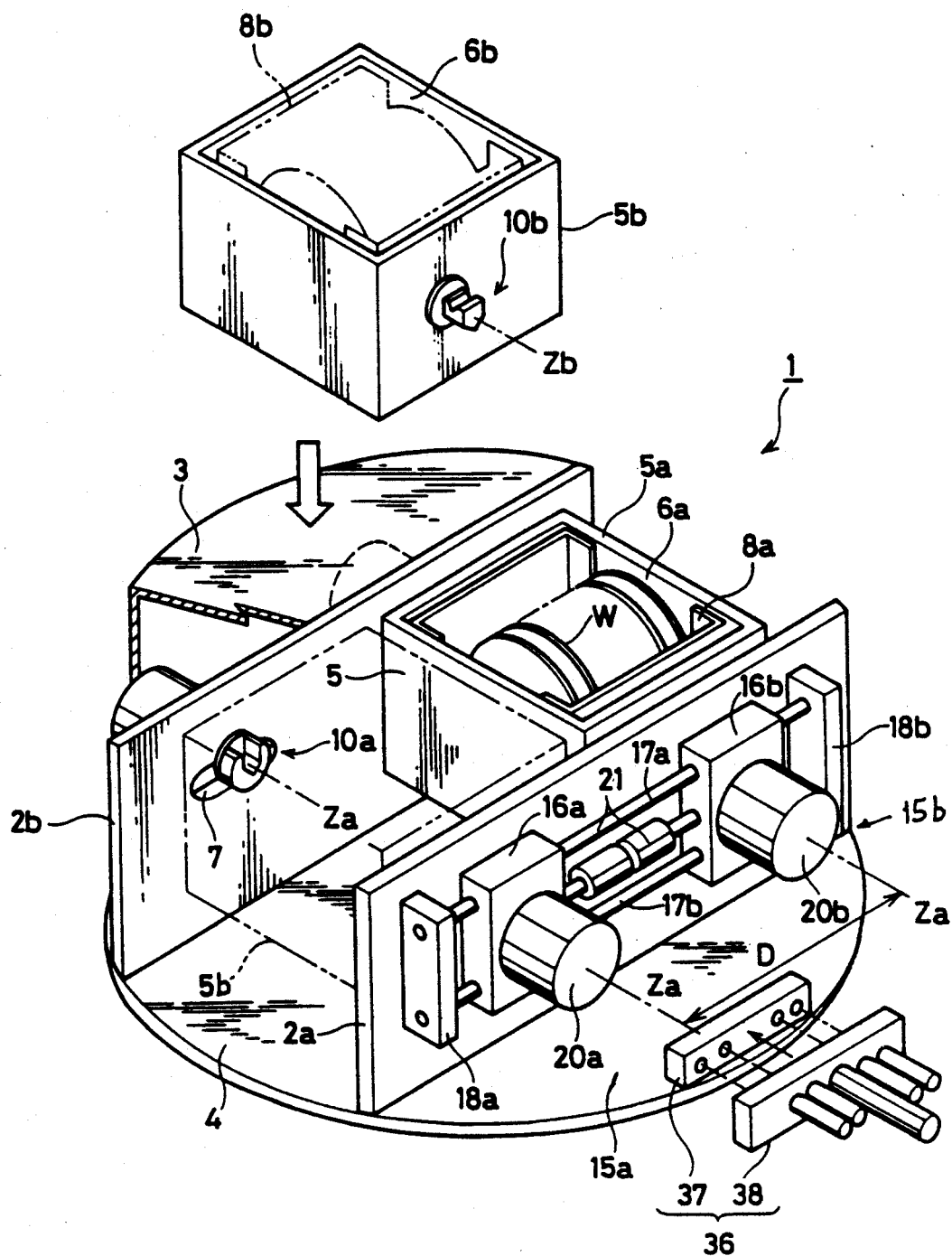
FIG. 4 is a perspective view of a rotor of a rotary wafer drier in accordance with the present invention.
Figure 4:
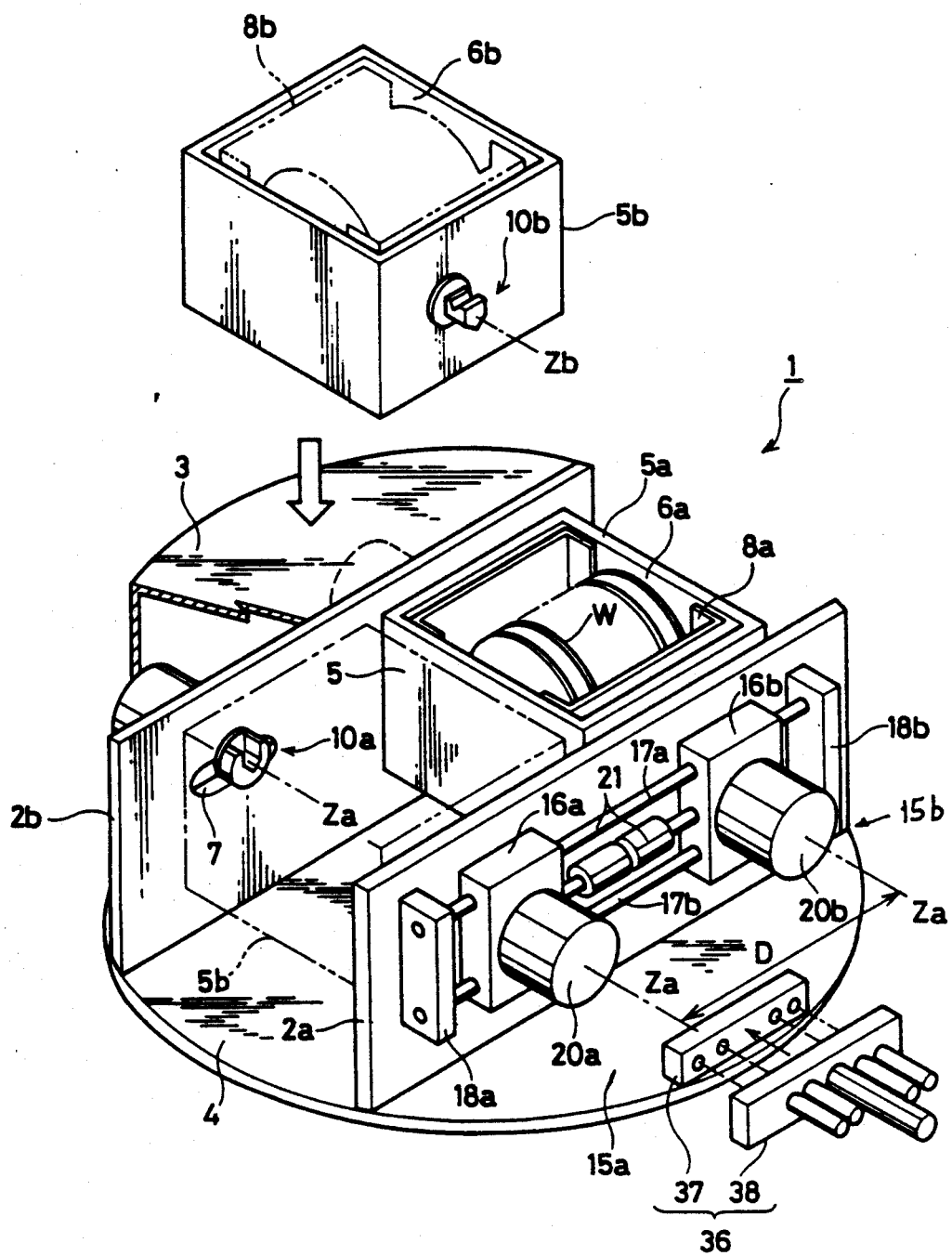

Referring to FIG. 4, the rotor 1 of the rotary wafer drier in accordance with the present invention comprises a turntable 4 which is rotated by a turntable driving motor (not shown) connected to a rotary driving axis (not shown), a pair of wall portions 2a and 2b opposing each other on the turntable 4, and a pair of cradles 5a and 5b swingably provided on the respective wall portions 2a and 2b. A pair of driven axis portions 10b for supporting the cradles 5a and 5b are provided on the surfaces of the cradles 5a and 5b facing the wall portions 2a and 2b. A pair of driving axis portions 10a swingably supporting the driven axis portions 10b of the cradles 5a and 5b are provided on the wall portions 2a and 2b. The driving axis portions 10a are supported by the supporting portions 15a and 15b provided on the side of the wall portion 2a different from that side on which the cradle exists. The structure of the side of the wall portion 2a will be described in the following. The support portion 15a comprises bearing portions 16a and 16b for rotatably supporting the driving axis portion 10a, and rotary actuators 20a and 20b provided on the bearing portions 16a and 16b for rotatably driving the driving axis portion 10a. The center Za of the axis of each of the rotary actuators 20a and 20b matches the center Zb of rotation of the driven axis portion 10b when the driven axis portion 10b is combined with the driving axis portion 10a. The driving axis portion 10a and the driven axis portion 10b constitute a support axis 10 when coupled in various manners as will be described below. The support portion 15a can be moved along an elongate hole 7 provided on the wall portion 2a. A pair of lugs 18a and 18b are provided on the outside of each of the pair of wall portions 2a and 2b, which lugs oppose each other. Two guides 17a and 17b are provided on the pair of lugs 18a and 18b for connecting the lugs 18a and 18b with each other. Holes through which the guides 17a and 17b pass are provided on each of the bearing portions 16a and 16b. Actuators 21 are provided along the guide portions 17a and 17b at an intermediate portion between the two bearing portions 16a and 16b. The bearing portions 16a and 16b move along the guide bars 17a and 17b by the operation of the actuators 21. Therefore, the distance D between the centers of rotation of the two support portions 15a and 15b can be adjusted by the actuators 21. A support portion having the same structure as described above is provided on the other wall portion 26. Consequently, the distance between the pair of cradles 5a and 5b can be also adjusted by the actuators 21.

In order to supply a driving source such as high pressure air to the actuator for driving the rotary actuators 20a and 20b and the actuators 21, connectors 36 for supplying a driving source are provided on prescribed positions on the turntable 4 and on the outside of the rotary drier. When the turntable 4 stops at a prescribed position, the externally-provided connector 38 for supply is opposed to the connector 37 on the turntable, as shown in FIG. 4, and the connectors are connected to each other, thereby supplying a source of power to the respective actuators.

The operation of the rotary drier will be described as following. A plurality of wafers that were subjected to wet surface treatment are housed in the cassettes 6a and 6b and contained in the cradles 5a and 5b of a prescribed size. On this occasion, the cassettes 8a and 8b are introduced from vertically above the cradles 5a and 5b into the cradles 5a and 5b, so that the receiving opening portions 6a and 6b of the cradles 5a and 5b are facing upward. In this state, the pair of cradles 5a and 5b have the driven axis portion 10b combined with a prescribed driving axis portion 10a as shown by the arrow in FIG. 4.

Figure 5A:
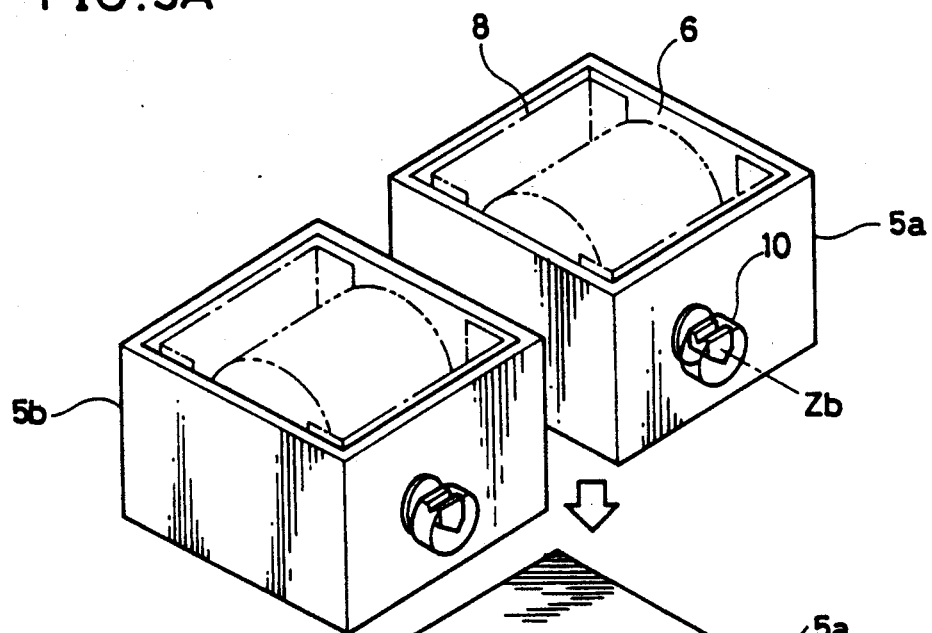
FIGS. 5A and 5B are perspective views showing the states of cradles when the wafers are received in the rotary drier and when the wafers are dried in the rotary drier of the present invention.
Figure 5B:
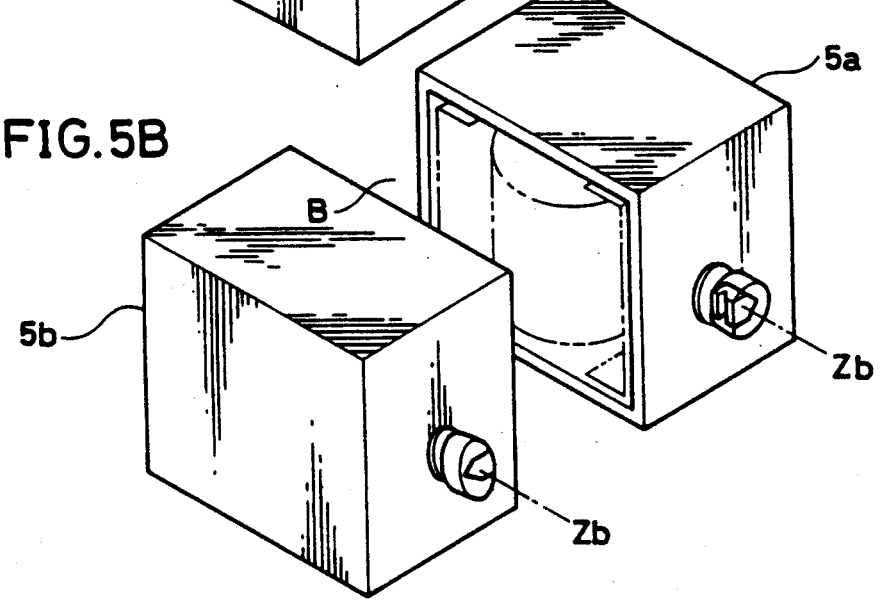

As shown in FIG. 5A, after the pair of cradles 5a and 5b are held at the prescribed positions, the rotary actuators 20a and 20b are operated so that the cradles 5a and 5b are held in an attitude in which the receiving opening portions 6 are facing the horizontal direction as shown in FIG. 5B. The distance D between the support portions 15a and 15b is adjusted by the actuator 21 so that the pair of cradles 5a and 5b or the cassettes 8a and 8b and the cradles 5a and 5b do not interfere with each other when the cradles 5a and 5b are moved from the attitude A shown in FIG. 5A to the attitude B shown in FIG. 5B.

The turntable 4 is rotated with the pair of cradles 5a and 5b kept in the state of FIG. 5B. Consequently, the centrifugal force works on the wafers W swishing off the liquid drops on the surfaces of the wafers W, and the wafers W are dried. The structure of the lower portions of the turntable 4, the rotary driving axis 28 for rotating the turntable 4 and the turntable driving motor 29 in this embodiment are the same as the conventional one described with reference to FIGS. 2 and 3, so that the description thereof is not repeated.

As described above, in the present invention, when wafers W having different diameters are to be dried, not the rotor 1 itself but only the cradles 5a and 5b corresponding to the diameter of the wafers W are changed at the portions of the support axis 10. Since the exchange is realized by the portions of the support axis 10, the center of the support axis does not deviate when the cradles 5a and 5b are changed. Therefore, the rotor 1 itself is well balanced even if the cradles 5a and 5b are changed. Consequently, drying can be easily carried out even if the wafers have different sizes, in a rotary drier of wafers.

It goes without saying that the pair of cradles 5a and 5b are well balanced in advance, and the rotor 1 itself is also well balance without the cradles 5a and 5b.

Specific embodiments of the support axis 10 of the rotary drier in accordance with the present invention will be described in the following. One of the support axes of the cradles will be described.

(1) First embodiment

Figure 6:
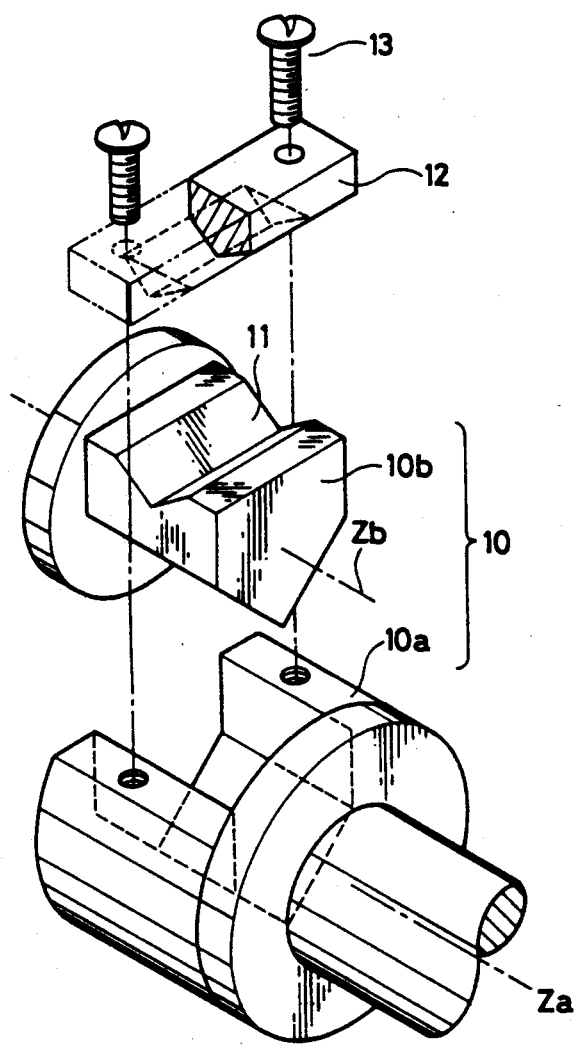
FIG. 6 is a perspective view showing a first embodiment of a support axis of the cradle.

Referring to FIG. 6, the first embodiment of a support axis 10 in accordance with the present invention comprises a driven axis portion 10b having a V-shaped cross section fixed on both side surfaces of the cradle 5, a driving axis portion 10a connected to a rotary actuator 20 having a groove for receiving the V-shaped cross section of the driven axis portion 10a, and a fixing member 12 engaging, when the driven axis portion 10b is combined with the driving axis portion 10a, with the V-shaped grooved 11 formed on the driven-axis portion 10b for fixing the combined portion. The fixing member 12 is fixed on the driving axis portion 10a by means of screws 13. When the driven axis portion 10b is combined with the driving-axis portion 10a, the center Zb of rotation of the driven-axis portion 10b coincides with the center Za of rotation of the rotary actuator 20.

When the driving axis portion 10a engages with the driven-axis portion 10b by the structure as shown in FIG. 6, there will be no deviation between the center of rotation of the cradle and the center of rotation of the rotary actuator even when the cradle 5 is changed. Therefore, the rotor as a whole is kept well balanced.

(2) Second embodiment

Figure 7:
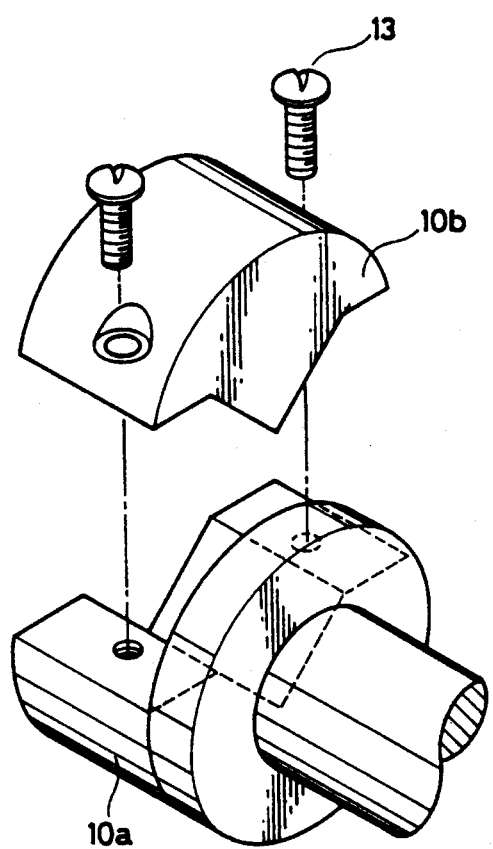
FIG. 7 is a perspective view showing a second embodiment of the support axis of the cradle in accordance with the present invention.

A second embodiment of a support axis 10 will be described with reference to FIG. 7. In this embodiment, the driven-axis portion 10b and the fixing member 12 in the first embodiment are made integral. The driven-axis portion 10b is fixed to the driving-axis portion 10a directly by means of screws 13.

(3) Third embodiment

Referring to FIG. 8, in accordance with a third embodiment of the support axis of the present invention, a V-shaped groove Sb intersecting the center Zb of rotation of the cradle 5 is formed at the V-shaped projection of the driven-axis portion 10b. An inverted V-shaped projection Sa is formed in a direction orthogonally intersecting the center Za of the rotary actuator so that it is engaged with the V-shaped groove Sb of the driven-axis portion 10b, on the V-shaped groove of the driving-axis portion 10a. Namely, in accordance with the third embodiment of the present invention, the driving-axis portion 10a and the driven-axis portion 10b are registered not only in the center axis directions Za and Zb but also in the direction orthogonally intersecting therewith. After the driven-axis portion 10b is combined with the driving-axis portion 10a, the two are fixed to each other by means of screws 13.

(4) Fourth embodiment

Figure 9:
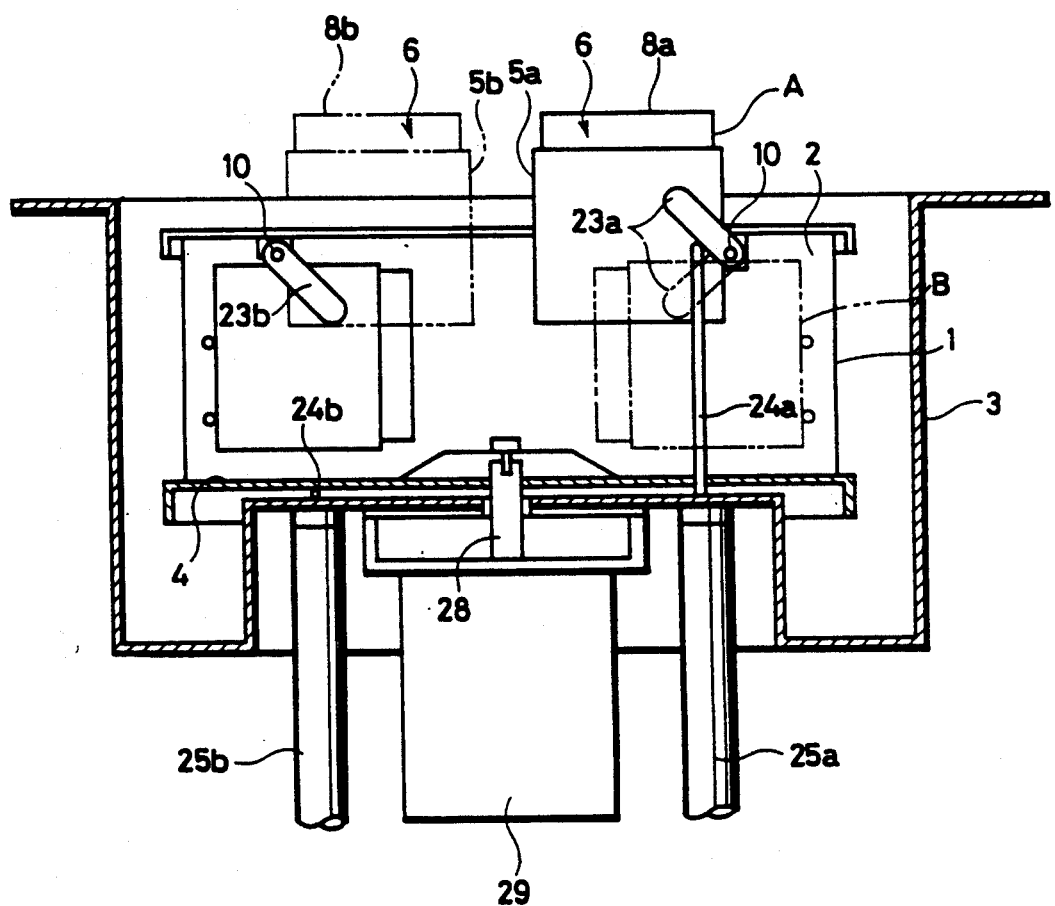
FIG. 9 shows a fourth embodiment of the support axis of the cradle in accordance with the present invention.

Referring to FIG. 9, a fourth embodiment of the present invention will be described. The support axis 10 in accordance with the fourth embodiment of the present invention is approximately the same as the conventional support axis shown in FIG. 1 except that the support axis 10 is removable.

In accordance with the fourth embodiment, the cradles 5a and 5b are supported on the wall portions 2 of the rotor 1 by means of the support axis 10 through swinging arms 23a and 23b swingably supporting the cradles 5a and 5b between the first attitude (A) in which the receiving opening portion 6 of the cradles 5a and 5b are facing upward and a second attitude (B) in which the receiving opening portion 6 of the cradles 5a and 5b facing the horizontal direction. The switching between the first and second positions is carried out by expanding/reducing the rods 24a and 24b of push-rod type actuators 25a and 25b provided below the rotor 1.

The cradles 5a and 5b receive the cassette 8a and 8b at a first position (A), and a wafers are then dried at the second position (B) as in other embodiments. The rods 24a and 24b of the push-rod type actuators 25a and 25b are held outside the rotor 1 while the rotor 1 is rotated. When the rotation of the rotor 1 is stopped, they are expanded to hold the cradle 5 at the first position (A).

Figure 10A:
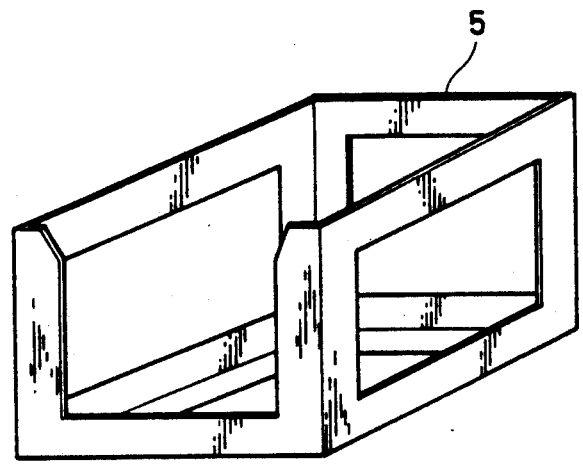
FIGS. 10A and 10B show different types of cradles employed in the rotary wafer drier in accordance with the present invention.
Figure 10B:
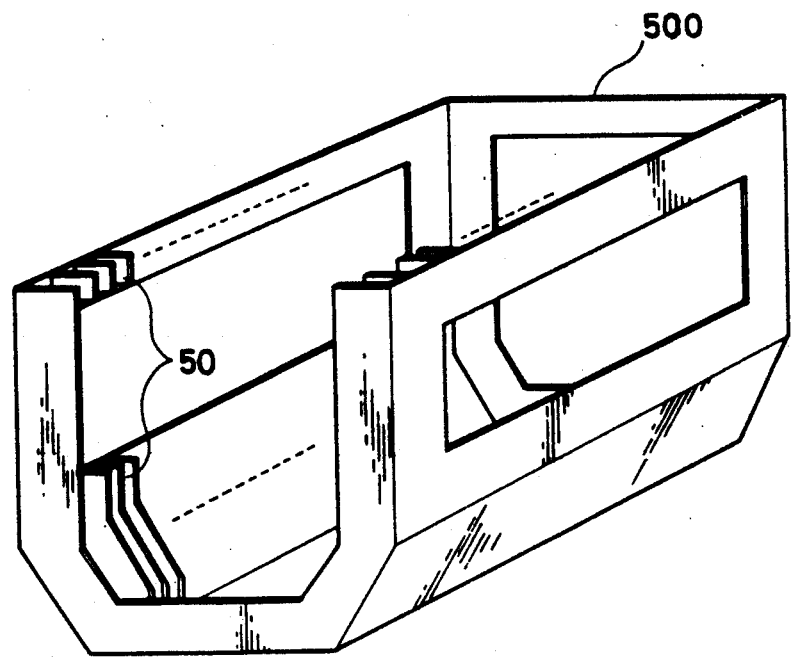

FIG. 10A and 10B show different types of cradles employed in the wafer rotary drier in accordance with the present invention. In the first to fourth embodiments, the cradle shown in FIG. 10A was used. A cassette 6 (FIG. 9) holding a plurality of wafers is contained in the cradle 5.

The cradle 500 shown in FIG. 10B comprises wafer-holding grooves 50 for holding a plurality of wafers in the cradle 500, with the wafers held by these grooves 50. Therefore, the cassette 6 is not used. The present invention can be applied not only to the cradle shown in FIG. 10A but also to the cradle shown in FIG. 10B. The driven-axis portion 10b serving as a support portion of the cradle is not shown in both figures.

As described above, according to the present invention, the cradle itself containing the wafers can be removed from the turntable in a rotary drier. Therefore, even if the diameter of the wafer is changed, only the cradles have to be exchanged, enabling drying of wafers in a simple manner. Unlike the conventional apparatus, it is unnecessary to prepare a plurality of turntables corresponding to the diameters of the wafers. Consequently, the cost of the rotary drier for wafers can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A rotary wafer drying apparatus, comprising:
   a rotating means for rotating about a prescribed position as a center;

a plurality of supporting means provided on said rotating means;

container means supported by said plurality of supporting means, each for holding a plurality of wafers;

said supporting means being arranged such that said container means are balanced with respect to said center irrespective of rotation when said rotating means is rotated with said container means supported by said supporting means;

swinging means for swingably holding said container means between a first position and a second position different from said first position; and means provided on said supporting means for releasably attaching said container means to said supporting means;

said supporting means comprising said swinging means;

said supporting means comprising a first member connected to said container means, and a second member having a connecting portion capable of swingably holding said first member between said first portion and said second position; and said releasable-attachment means being for separating the connecting portion of said first and second members.

2. A rotary wafer drying apparatus according to claim 1, wherein:

said plurality of supporting means comprises two pairs of supporting means; said two pairs of supporting means being arranged symmetrically about said prescribed position as a center.

3. A rotary wafer drying apparatus according to claim 1, wherein:

said support means has a third member for swingably holding said container means between said first and second position; and said swinging means is also for swinging said third member.

4. A rotary wafer drying apparatus according to claim 3, wherein:

said third member swing in upward and downward directions about a prescribed position; and said swinging means includes moving means for moving said third member in said upward and downward directions.

5. A rotary wafer drying apparatus, comprising:

a rotating means for rotating about a prescribed position as a center;

a plurality of supporting means provided on said rotating means;

container means supported by said plurality of supporting means, each for holding a plurality of wafers;

said supporting means being arranged such that said container means are balanced with respect to said center irrespective of rotation when said rotating means is rotated with said container means supported by said supporting means;

swinging means for swingably holding said container means between a first position and a second position different from said first position; and means provided on said supporting means for releasably attaching said container means to said supporting means;

said supporting means comprising said swinging means;

said supporting means comprising a first member connected to said container means, and a second member having a connecting portion capable of swingably holding said first member between said first position and second position;

said releasable-attachment means being for separating the connecting portion of said first and second members;

said plurality of supporting means comprising two pairs of supporting means, said two pairs of supporting means being arranged symmetrically about said prescribed position as a center;

said first supporting means being arranged at a first position;

said second supporting means being arranged at a second position;

a distance between said supporting means being defined by said first and second position; and said plurality of supporting means further including a distance-adjusting means for changing said distance.

6. A rotary wafer drying apparatus according to claim 5, wherein:

said rotary wafer drying apparatus is arranged to receive said plurality of wafers from a prescribed conveyor;

said container means is arranged to receive said plurality of wafers at said first position; and said rotary wafer drying apparatus further being arranged to dry said plurality of wafers at said second position.

7. A rotary wafer drying apparatus according to claim 6, wherein:

said plurality of wafers area arranged in a lengthwise direction at said position; and said plurality of wafers are arranged in a widthwise direction at said second position.

8. A rotary wafer drying apparatus, comprising:

a rotating means for rotating about a prescribed position as a center;

a plurality of supporting means provided on said rotating means;

container means supported by said plurality of supporting means, each for holding a plurality of wafers;

said supporting means being arranged such that said container means are balanced with respect to said center irrespective of rotation when said rotating means is rotated with said container means supported by said supporting means;

swinging means for swingably holding said container means between a first position and a second position different from said first position; and means provided on said supporting means for releasably attaching said container means to said supporting means;

said supporting means comprising said swinging means;

said supporting means comprising a first member connected to said container means, and a second member having a connecting portion capable of swingably holding said first member between said first position and said second position;

said releasable-attachment means being for separating the connecting portion of said first and second members;

said first member having a concave portion; and said second member comprising a convex portion engaging with the concave portion of said first member.

* * * * *